United States Patent
Lee et al.

(10) Patent No.: US 9,508,275 B2
(45) Date of Patent: Nov. 29, 2016

(54) DISPLAY DEVICE

(71) Applicant: SAMSUNG ELECTRONICS CO., LTD., Suwon-si (KR)

(72) Inventors: Cho-Young Lee, Yongin-si (KR); Hye Jin Kim, Jeongeup-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 14/611,608

(22) Filed: Feb. 2, 2015

(65) Prior Publication Data
US 2015/0255519 A1    Sep. 10, 2015

(30) Foreign Application Priority Data

Mar. 10, 2014 (KR) .......... 10-2014-0027586

(51) Int. Cl.
| | |
|---|---|
| *G06F 3/038* | (2013.01) |
| *G09G 3/00* | (2006.01) |
| *H01L 51/52* | (2006.01) |
| *G02F 1/15* | (2006.01) |
| *G02F 1/1333* | (2006.01) |

(52) U.S. Cl.
CPC .......... *G09G 3/007* (2013.01); *H01L 51/5262* (2013.01); *H01L 51/5271* (2013.01); *G02F 1/15* (2013.01); *G02F 2001/133342* (2013.01); *G09G 2300/0491* (2013.01); *H01L 2251/5307* (2013.01); *H01L 2251/5323* (2013.01)

(58) Field of Classification Search
CPC ............ G06G 3/007; G06G 2300/0491; H01L 51/5262; H01L 51/5271; H01L 2251/5323; H01L 2251/5307; G02F 1/15; G02F 2001/133342
See application file for complete search history.

(56) References Cited

U.S. PATENT DOCUMENTS

| | | | | |
|---|---|---|---|---|
| 6,481,851 B1* | 11/2002 | McNelley | .......... | G02B 27/2292 345/5 |
| 2005/0248697 A1* | 11/2005 | Ukawa | ................ | G02F 1/13476 349/98 |
| 2007/0075943 A1 | 4/2007 | Shin et al. | | |
| 2008/0238828 A1 | 10/2008 | Nakayama et al. | | |
| 2009/0231662 A1 | 9/2009 | Sorensson et al. | | |
| 2011/0038030 A1* | 2/2011 | Roosendaal | .............. | E06B 9/24 359/296 |
| 2011/0267279 A1 | 11/2011 | Alvarez Rivera et al. | | |
| 2012/0140304 A1 | 6/2012 | Kuhlman et al. | | |

FOREIGN PATENT DOCUMENTS

| | | |
|---|---|---|
| EP | 1801881 A1 | 6/2007 |
| KR | 10-2009-0115315 A | 11/2009 |

OTHER PUBLICATIONS

Communication dated Jun. 30, 2015, issued by the European Patent Office in counterpart European Application No. 15151062.5.

* cited by examiner

*Primary Examiner* — Andrew Sasinowski
*Assistant Examiner* — Gerald Oliver
(74) *Attorney, Agent, or Firm* — Sughrue Mion, PLLC (57) ABSTRACT

A display device is provided. The display device includes a transparent display panel; and an optical switching element arranged on the transparent display panel and configured to be switched to one of a transmissive state, a non-transmissive state, and a reflective state, wherein the optical switching element includes a non-transmission layer formed to contact the transparent display panel and configured to switch to the transmissive state or the non-transmissive state, and a reflection layer formed on a first side of the non-transmission layer and configured to switch to the transmissive state or the reflective state.

18 Claims, 11 Drawing Sheets

DISPLAY DEVICE

CROSS-REFERENCE TO RELATED APPLICATION

This application claims priority from Korean Patent Application No. 10-2014-0027586, filed on Mar. 10, 2014, in the Korean Intellectual Property Office, the entire disclosure of which is incorporated hereby incorporated by reference.

BACKGROUND

Field

Apparatuses consistent with the exemplary embodiments relate to a display device.

Description of the Related Art

A display device displays visual and stereographic image information. Currently, high performance flat display devices are being developed. The installation space of such high performance flat display devices is less constrained due to their reduced weight and volume as compared with Cathode Ray Tubes (CRTs). Further, a large-screen image is easily implemented and high image quality is provided.

Examples of flat display device include a Liquid Crystal Display Device (LCD), Electro-Luminescence Display Device (ELD), Field Emission Display Device (FED), Plasma Display Panel (PDP), Thin Film Transistor Liquid Crystal Display (TFT-LCD), Flexible Display, Organic Light-Emitting Diode (OLED), or the like.

Such a display device is applied not only to televisions, but also to various fields, and thus the forms of the display device can vary greatly.

SUMMARY

An aspect of an exemplary embodiment provides a display device which improves utilization of both sides of a transparent display panel.

In accordance with an aspect of the exemplary embodiments, a display device is provided. The display device includes a transparent display panel; and an optical switching element arranged on the transparent display panel and configured to switch to any of transmissive state, non-transmissive state, and reflective state, wherein the optical switching element includes a non-transmission layer formed to contact the transparent display panel and switched into transmissive state or non-transmissive state, and a reflection layer formed on a first side of the non-transmission layer and configured to switch to the transmissive state or the reflective state.

The optical switching element may include a non-transmission layer formed to contact the transparent display panel and switched into transmissive state or non-transmissive state, and a reflection layer formed on one side of the non-transmission layer and switched into transmissive state or reflective state.

The non-transmission layer may be made of a transition metal oxide having a cathodic characteristic.

If a voltage is applied to the optical switching element, the non-transmission layer and the reflection layer may be both switched to the transmissive state, or the non-transmission layer may be switched to the non-transmissive state and the reflection layer may be switched to the reflective state.

The non-transmission layer may be made of a transition metal oxide having an anodic characteristic.

If a voltage is applied to the optical switching element, the non-transmission layer may be switched to the non-transmissive state and the reflection layer may be switched to the transmissive state, or the non-transmission layer may be switched to the transmissive state while the reflection layer may be switched to the reflective state.

The non-transmission layer may include one of a single layered film made of a single material among multiple transition metal oxides, a single layered film made of a combination of different materials, a multi-layered film formed of a plurality of single layered films each made of a single material, and a multi-layered film formed of a plurality of single layered films each made of a combination of different materials.

The display device may further include an electrolyte layer formed between the non-transmission layer and the election layer; and a transparent electrode formed on a second side of the non-transmission layer.

The reflection layer may be made of a metal or metal alloy.

If there are a plurality of optical switching elements, a first optical switching element of the plurality of optical switching elements is arranged on a first side of the transparent display panel and a second optical switching element of the plurality of optical switching elements is arranged on a second side of the transparent display panel.

A non-transmission layer and a reflection layer of the first optical switching element formed on a first side of the transparent display panel may be in the transmissive state, and a non-transmission layer and a reflection layer of the second optical switching element formed on the second side of the transparent display panel may be in the non-transmissive state and the reflective state, respectively.

A non-transmission layer and a reflection layer of the first optical switching element and a non-transmission layer and a reflection layer of the second optical switching element may be in the transmissive state.

If a non-transmission layer of a first optical switching layer formed on a first side of the transparent display panel is in the non-transmissive state, a reflection layer of the first optical switching layer may be in the reflective state, and if a non-transmission layer of a second optical switching layer formed on a second side of the transparent display panel is in the non-transmissive state, a reflection layer of the second optical switching layer may be in the reflective state.

If a non-transmission layer of the first optical switching element and a non-transmission layer of the second optical switching element are in the non-transmissive state, a reflection layer of the first optical switching element and a reflection layer of the second optical switching element is in the transmissive state, and if the non-transmission layer of the first optical switching element and the non-transmission layer of the second optical switching element are in the transmissive state, the reflection layer of the first optical switching element and the reflection layer of the second optical switching element are in the reflective state.

The transparent display panel may be an Organic Light Emitting Diode (OLED) display panel.

In accordance with another aspect of the exemplary embodiments, a display device is provided. The display device includes a transparent display panel; an optical switching element arranged on the transparent display panel; and a driver configured to switch a first side of the optical switching element into a transmissive state or a non-transmissive state and may switch a second side of the optical switching element into the transmissive state or a reflective state.

Other aspects, advantages, and salient features of the inventive concept will become apparent to those skilled in the art from the following detailed description, which, taken in conjunction with the annexed drawings, discloses exemplary embodiments of the disclosure.

BRIEF DESCRIPTION OF THE DRAWINGS

The above and other features will become more apparent by describing in detail exemplary embodiments thereof with reference to the attached drawings in which.

Throughout the drawings, like reference numerals will be understood to refer to like parts, components, and structures.

DETAILED DESCRIPTION

The inventive concept will now be described more fully with reference to the accompanying drawings, in which exemplary embodiments of the disclosure are shown. The disclosure may, however, be embodied in many different forms and should not be construed as being limited to the exemplary embodiments set forth herein; rather, these exemplary embodiments are provided so that this disclosure will be thorough and complete, and will fully convey the concept of the disclosure to those skilled in the art. Like reference numerals in the drawings denote like elements, and thus their description will be omitted. In the description of the present disclosure, if it is determined that a detailed description of commonly-used technologies or structures related to the exemplary embodiments of the present disclosure may unnecessarily obscure the subject matter of the exemplary embodiments, the detailed description will be omitted. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

Exemplary embodiments will now be described with reference to accompanying drawings.

Figure 1:
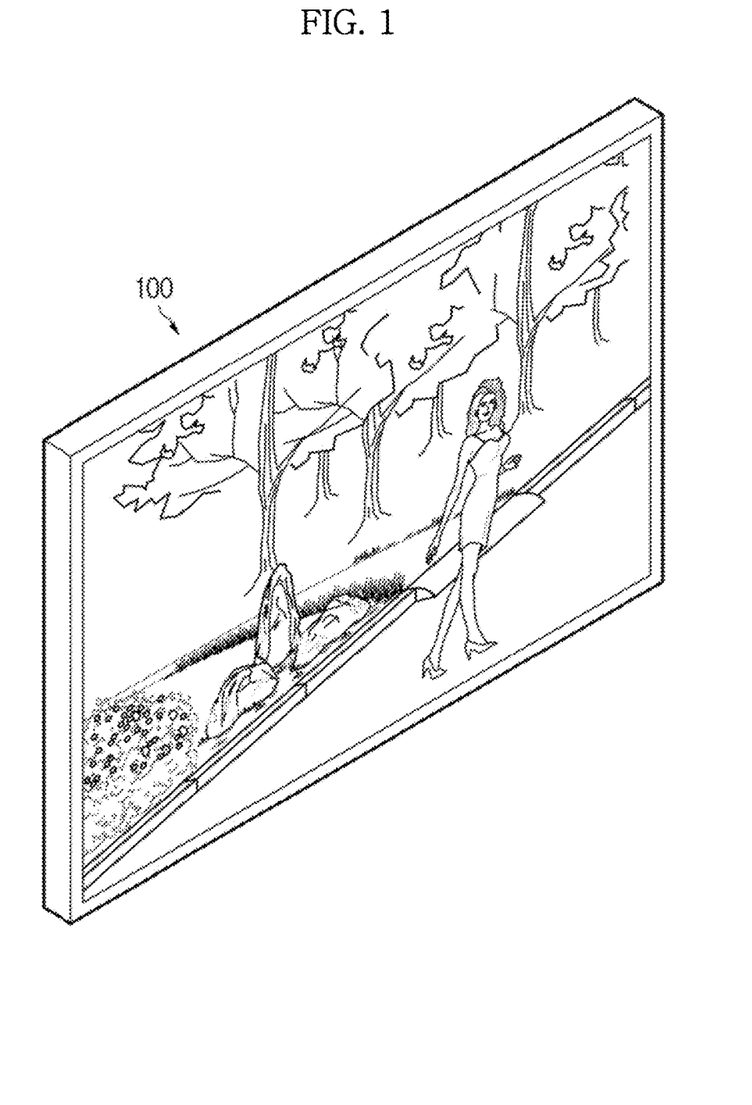
FIG. 1 is a perspective view of a display device, in accordance with an exemplary embodiment.

FIG. 1 is a perspective view of a display device, in accordance with an exemplary embodiment.

A display device 100 as used herein may be applied to, for example, televisions, cameras, and various appliances. The display device 100 is not limited thereto and may also be applied to windows, partitions for space division, which are arranged in homes or buildings, various guideboards installed outdoors, installations, etc.

As shown in FIG. 1, the display device 100 may include a transparent display panel configured to output image signals. The display device 100 may further include optical switching element(s) arranged on one or both sides of the transparent display panel, which will be described later in detail.

The transparent display panel may be a luminescent type display panel, such as a self-emitting Cathode Ray Tube (CRT), an Electro Luminescence (EL) display panel, an Organic Light Emitting Diode (OLED) display panel, a Vacuum Fluorescent Display (VFD), a Field Emission Display (FED), a Plasma Display Panel (PDP), etc., and may also have a non-luminescent type, such as a Liquid Crystal Display (LCD) that is unable to emit light by itself.

The OLED display panel includes a self-luminescent organic material that emits light by itself using an electroluminescence phenomenon in which a fluorescent organic compound emits light when an electric current flows in the organic compound. Furthermore, the OLED display panel may be driven at a low voltage, may be made in a thin film type, and may have a wide viewing angle and quick speed of response, according to which the image quality remains the same even when viewed right from the side and there is no afterimage on the screen as compared with a common LCD display panel. Since the OLED display panel has better image quality than the LCD in a small screen and requires a simple manufacturing process, the OLED display panel is cost competitive. As a main color implementation method for the OLED display panel, there may be a three-color (Red, Green, and Blue)-independent pixel method, a Color Conversion Method (CCM) method, a color filter method, etc.

In addition, the OLED display panel may be classified into a small molecule OLED panel and polymer OLED panel according to an amount of organic compounds included in luminescent materials of the OLED display panel and into a Passive Matrix OLED (PM-OLED) panel and an Active Matrix OLED (AM-OLED) panel according to the driving method. The PM-OLED panel has positive and negative electrodes arranged in columns and rows. The negative electrode is supplied with a scanning signal from a row driving circuit and in this regard, only one row is selected from among the multiple rows. A column driving circuit provides a data signal to each pixel. The AM-OLED panel controls signals input per pixel using thin film transistors.

Figure 2:
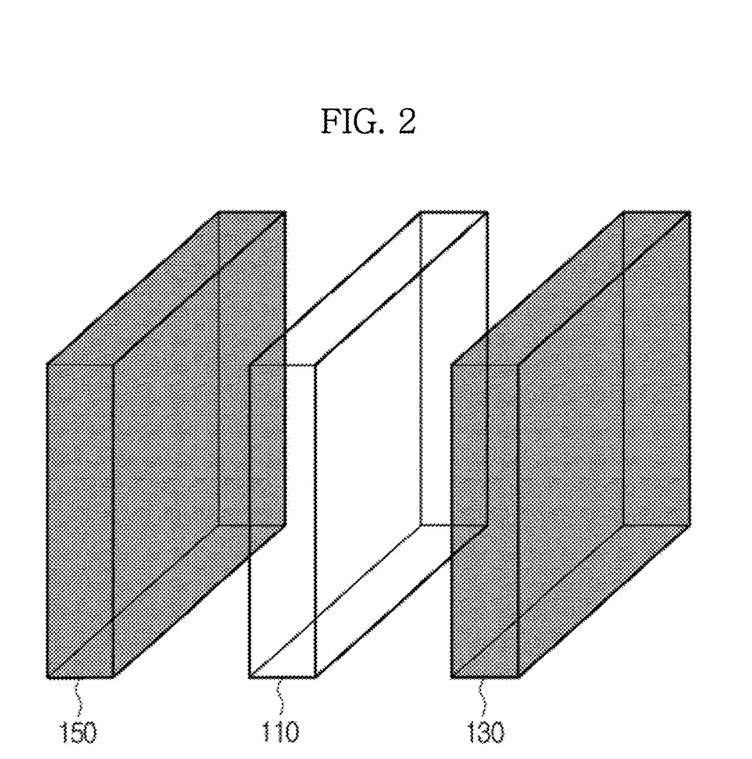
FIG. 2 is an exploded view of a display device, in accordance with an exemplary embodiment.
Figure 3:
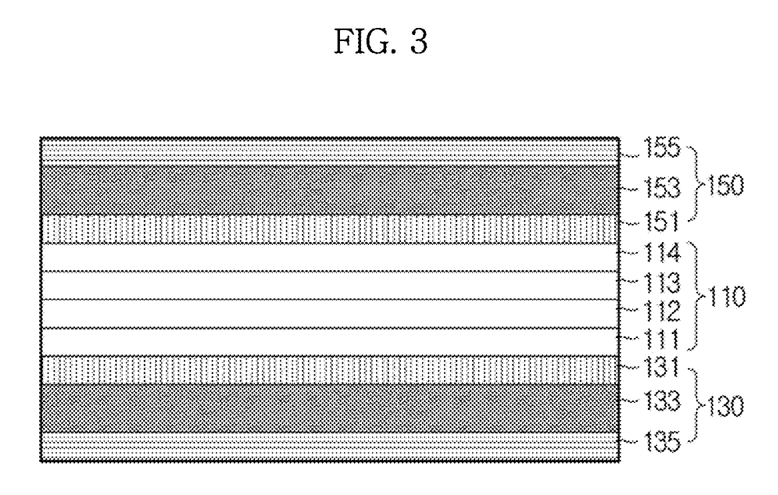
FIG. 3 is a cross-sectional view of an exemplary embodiment of a combined structure of a display panel and optical switching elements, in accordance with an exemplary embodiment.
Figure 4:
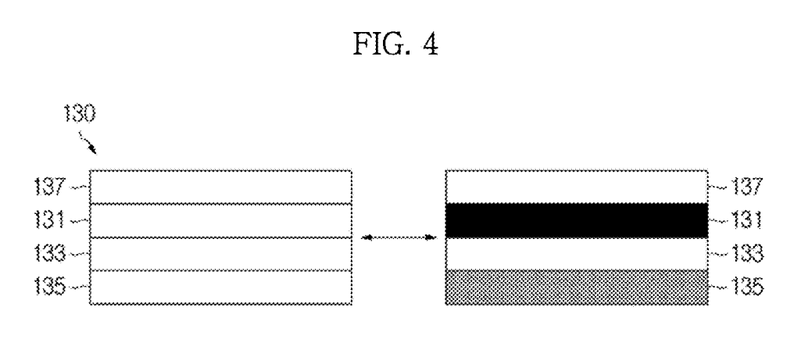
FIG. 4 is a detailed cross-sectional view of an optical switching element, in accordance with an exemplary embodiment.

FIG. 2 is an exploded view of a display device, in accordance with an exemplary embodiment, FIG. 3 is a cross-sectional view of a combined structure of a display panel and optical switching elements, in accordance with an exemplary embodiment, and FIG. 4 is a detailed cross-sectional view of an optical switching element, in accordance with an exemplary embodiment.

An example of the display panel, which corresponds to an AM-OLED display panel, will now be described.

As shown in FIG. 2, the display device 100 may include a transparent display panel 110, and an optical switching element 130 and an optical switching element 150 which are arranged on the transparent display panel 110 and which can switch to any one of a transmissive, a non-transmissive, and a reflective state.

As shown in FIG. 3, the transparent display panel 110 may be formed by sequentially combining a Thin Film Transistor Array Panel (TFT panel) 111, an organic layer 112, a glass layer 113, and a polarized panel 114. The TFT panel 111 may apply a certain current to the organic layer 112 to emit light. The TFT panel 111 may control signals input per pixel.

The organic layer 112 may form an organic light emitting layer in a form of a functional thin film between an anode (positive electrode) and cathode (negative electrode). The organic layer 112 may be an organic light emitting device that emits light while electrons injected from the negative electrode and holes injected from the positive electrode reunite.

More specifically, the organic layer 112 may emit light by means of a potential barrier between an electrode and an organic material of the organic layer 112. That is, if electricity is applied to the electrode, electrons generated at the positive electrode and holes generated at the negative electrode reunite and a band gap generated at this moment causes the emission of light. The band gap has a numerical value inherent to the organic material, which influences wavelengths of colors to be emitted. The greater the band gap, the greater the energy. Thus, as the band gap increases, light from long wavelengths toward short wavelengths, i.e., from red toward blue, may be emitted.

Although not shown, the organic layer 112 may include a hole-related layer, an electron-related layer, and a light emitting layer. The hole-related layer may be divided into a hole injection layer and a hole carrier layer, and similarly, the electron-related layer may be divided into an electron injection layer and an electron carrier layer. When a voltage applied to the electrode, holes and electrons are injected and carried through the positive and negative electrodes, respectively, which leads to the generation of positive and negative polarons within the light emitting layer by interaction with phonons. The polarons encounter one another and reunite to generate exitons. The exitons diffuse to generate light and become a low energy level. The generated light is emitted toward the indium tin oxide (ITO) and glass layer 113.

The glass layer 113 serves to shield the organic layer 112 entirely from an external environment, i.e., to package the organic layer 112, in order to avoid degradation of the organic layer 112 by preventing the organic layer 112 from sensitively reacting with moisture and oxygen.

The polarized panel 114 enables light of an image output through the glass layer 113 to be output in a single direction.

As shown in FIGS. 2 and 3, if there are multiple optical switching elements, the multiple optical switching elements 130 and 150 may be, but not exclusively, arranged on either side of the transparent display panel 110, or alternatively, may be combined on one side of the transparent display panel 110.

As shown in FIG. 3, the optical switching element 130 may include a non-transmission layer 131, a reflection layer 135, and an electrolyte layer 133 placed between the non-transmission layer 131 and the reflection layer 135. The electrolyte layer 133 may be made of multiple layers. Further, the optical switching element 150 may include a non-transmission layer 151, a reflection layer 155, and an electrolyte layer 153 placed between the non-transmission layer 151 and the reflection layer 155. The electrolyte layer 153 may be made of multiple layers.

The non-transmission layer 131 may be formed to contact the transparent display panel 110 and may be switched into the transmissive state or the non-transmissive state. In other words, when a voltage is applied to the optical switching element 130, the non-transmission layer 131 may be switched into the transmissive state or the non-transmissive state. The transmissive state refers to a state in which light transmission is allowed while the layer is in a transparent state, and the non-transmissive state refers to a state in which light transmission is not allowed while the layer is in an opaque state. The non-transmission layer 131 may also be defined as a layer which is switched to the transmissive state or the non-transmissive state according to the application of a voltage.

The non-transmission layer 131 may be made of transition metal oxides having a cathodic characteristic, but is not limited thereto. The transition metal oxides are materials which are usually transparent but switched into an opaque state if receiving protons. It is also possible for the non-transmission layer 131 to be formed with multiple thin film layers to implement a color near to black.

The reflection layer 135 may be formed on one side of the non-transmission layer 131 and may be switched into transmissive state or reflective state. The reflective state may be a mirror state in which light is reflected. The reflection layer 135 may also be defined as a layer which can be switched to the transmissive state or the reflective state according to application of a voltage. The reflection layer 135 may be made of metals or metal alloys, but is not limited thereto.

When a voltage is applied, the non-transmission layer 131 and reflection layer 135 may trigger an oxidation-reduction reaction which causes optical switching. Due to the opposite oxidation and reduction, the layers may be both in the transmissive state (transparent state) or in the non-transmissive state and reflective state, respectively.

As shown in FIG. 4, the optical switching element 130 may further include a transparent electrode 137 formed on the other side of the non-transmission layer 131. That is, the optical switching element 130 may have the transparent electrode 137, the non-transmission layer 131, the electrolyte layer 133, and the reflection layer 135 arranged in the order named, from the transparent display panel 110.

It will be appreciated that the optical switching element 130 may further include a layer to enhance the characteristics in addition to what has been described.

As shown in FIG. 3, the non-transmission layer 131 and reflection layer 135 of the optical switching element 130 may be both in the transmissive state when a voltage is applied to the both layers 131 and 135, or the non-transmission layer 131 may be in the non-transmissive state and the reflection layer 135 may be in a reflective state.

Figure 5:
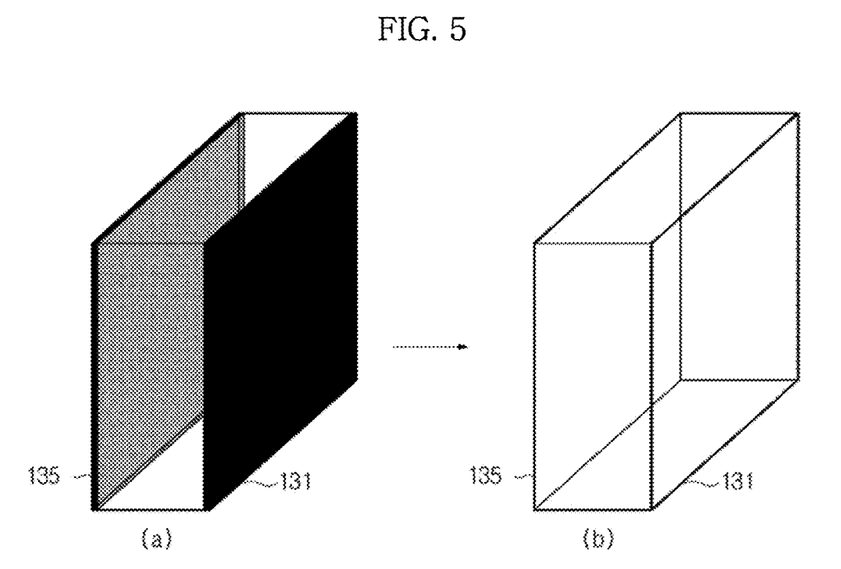
FIG. 5 illustrates a display device for explaining a switching method of an optical switching element, in accordance with an exemplary embodiment.

FIGS. 5A and 5B illustrate a display device for explaining a switching method of an optical switching element, in accordance with an exemplary embodiment.

Referring to FIGS. 5A and 5B, if the non-transmission layer 131 of the optical switching element 130 formed on one side of the transparent display panel 110 is in the non-transmissive state, the reflection layer 135 may be in the reflective state, and if a non-transmission layer 151 of the optical switching element 150 formed on the other side of the transparent display panel 110 is in the non-transmissive state, the reflection layer 155 may be in the reflective state.

Specifically, as shown in FIGS. 5A and 5B, when a voltage is applied to the optical switching element 130, the non-transmission layer 131 may be switched into the non-transmissive state and simultaneously, the reflection layer 135 may be switched into the reflective state. In the non-transmissive state, the non-transmission layer 131 may be opaque in color. For example, the non-transmission layer 131 may be black, blue, brown, etc.

Furthermore, as shown in FIG. 5B, when a voltage is applied to the optical switching element 130, the non-transmission layer 131 and the reflection layer 135 may both be switched into the transmissive state.

Figure 6:
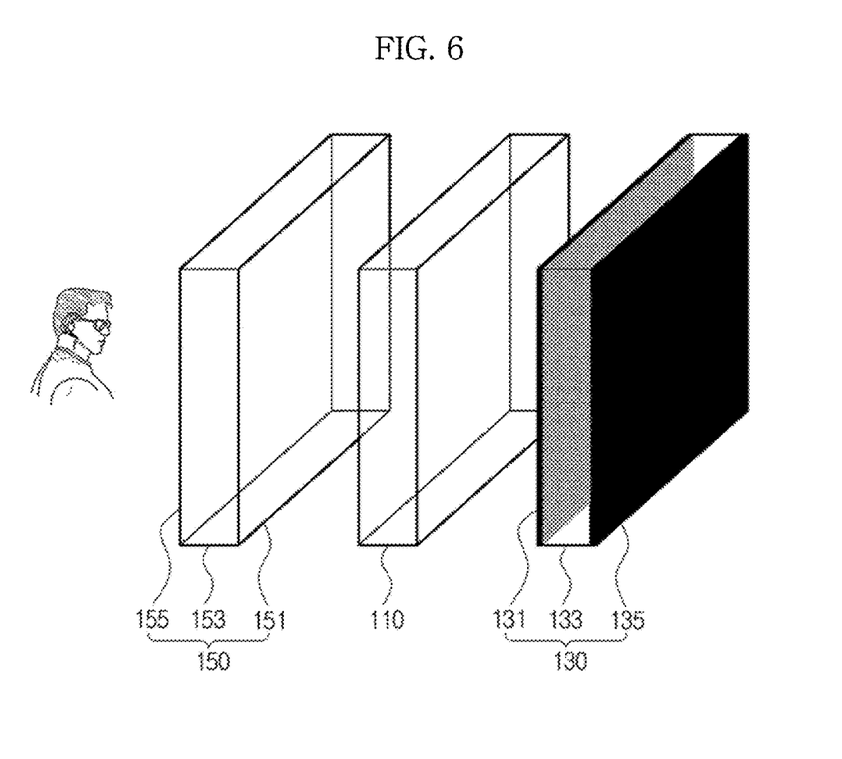
FIGS. 6, 7 and 8 illustrate display devices, according to various exemplary embodiments.
Figure 7:
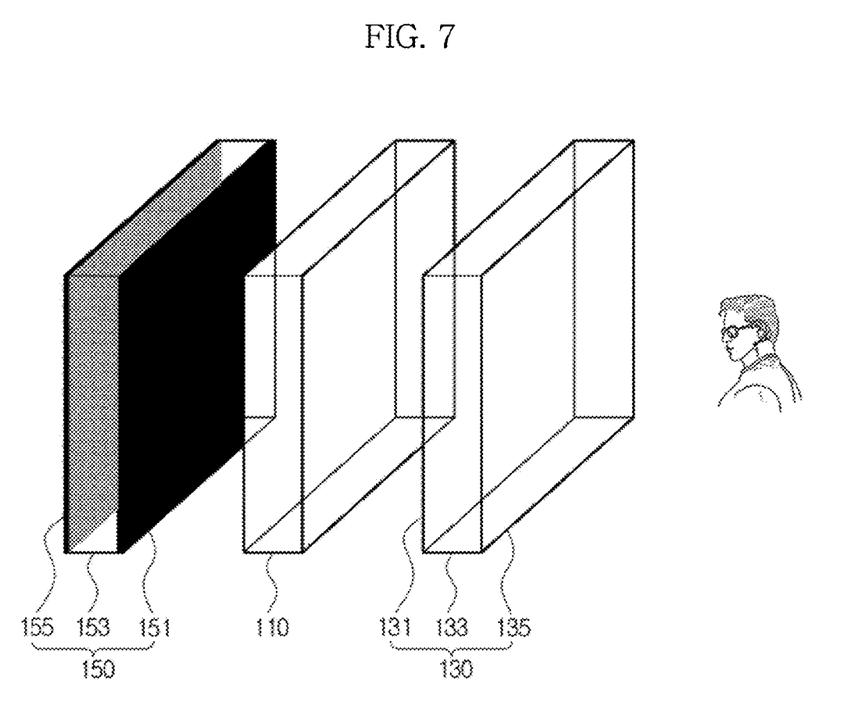
Figure 8:
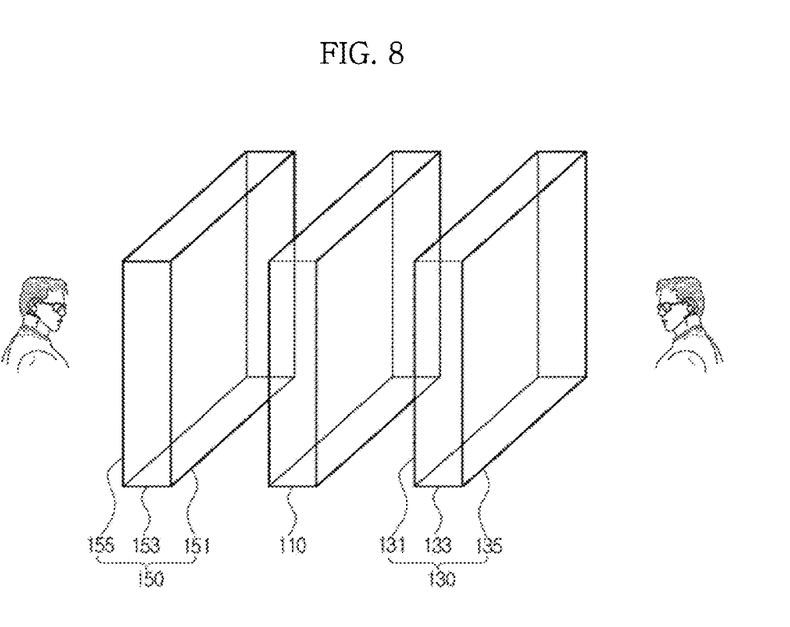

FIGS. 6, 7 and 8 illustrate various exemplary embodiments of a display device, which will be described given that the optical switching element as shown in FIG. 4 is applied to the display device.

If an image is to be viewed from one direction of the transparent display panel 110, as shown in FIG. 6, by applying a negative voltage (−V) to the optical switching element 130 formed on one side of the transparent display panel 110 while applying a positive voltage (+V) to the optical switching element 150 formed on the other side of the transparent display panel 110, the non-transmission layer 131 and the reflection layer 135 of the optical switching element 130 may be switched into the non-transmissive state and reflective state, respectively, and the non-transmission layer 151 and reflection layer 155 of the optical switching element 150 may be switched into the transmissive state.

If an image is to be viewed from another direction (the opposite direction of what is shown in FIG. 6) of the transparent display panel 110, as shown in FIG. 7, by applying a positive voltage (+V) to the optical switching element 130 formed on one side of the transparent display panel 110 while applying a negative voltage (−V) to the optical switching element 150 formed on the other side of the transparent display panel 110, the non-transmission layer 131 and reflection layer 135 of the optical switching element 130 may be switched into the transmissive state and the non-transmission layer 151 and reflection layer 155 of the optical switching element 150 may be switched into the non-transmissive state and reflective state, respectively.

As such, when an image is viewed from one direction of the transparent display panel 110, an optical switching element in an opposite direction stays in the non-transmissive and mirror (reflective) states, thereby enabling the image to be viewed with an enhanced contrast ratio while providing a mirror function in the opposite direction.

Furthermore, if an image is to be viewed from both directions of the transparent display panel 110, as shown in FIG. 8, by applying the positive voltage (+V) to both of the optical switching elements 130 and 150 formed on either side of the transparent display panel 110, their respective non-transmission layers 131 and 151 and reflection layers 135 and 155 may be switched into the transmissive state.

Although not shown, if it is desired that images are not viewed through the transparent display panel 110, it may be possible to keep both of the optical switching elements 130 and 150 in the transmissive state, or use only one of the optical switching elements 130 and 150 to be in the mirror state, or use both of them to be in the mirror state. This may possibly utilize the display device in accordance with the present disclosure as a partition to divide a particular space.

Figure 9:
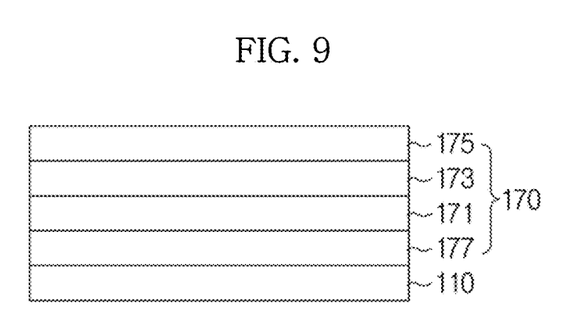
FIG. 9 is a cross-sectional view of a combined structure of a display panel and optical switching element, in accordance with an exemplary embodiment.
Figure 10:
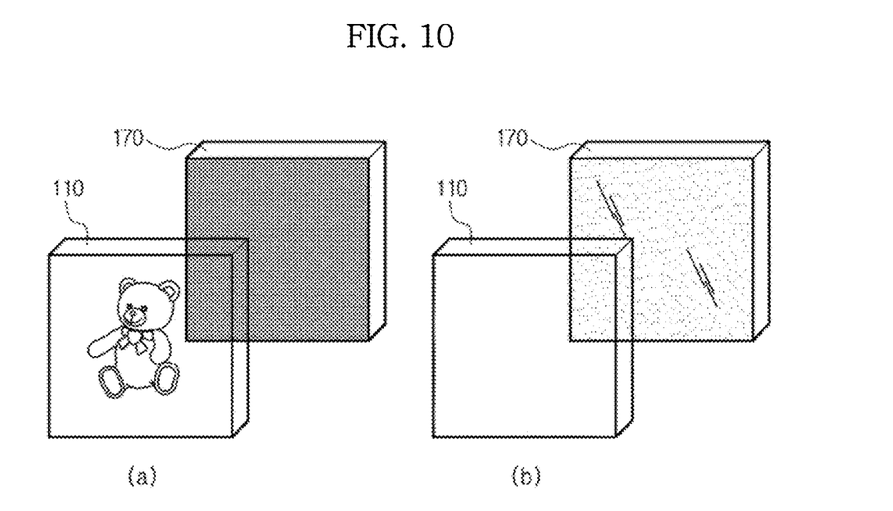
FIG. 10 illustrates the display device of FIG. 9, in accordance with an exemplary embodiment.

FIG. 9 is a cross-sectional view of another exemplary embodiment of a combined structure of a display panel and an optical switching element, which will be described with reference to FIG. 10.

Referring to FIG. 9, the display device may include the transparent display panel 110 and an optical switching element 170.

As shown in FIG. 3, the transparent display panel 110 may be formed by sequentially combining the TFT panel 111, the organic layer 112, the glass layer 113, and the polarized panel 114. The TFT panel 111 may apply a certain current to the organic layer 112 to emit light. The TFT panel 111 may control signals input per pixel.

As shown in FIG. 9, the optical switching element 170 may include a transparent electrode 177 formed to contact the transparent display panel 110, a non-transmission layer 171 formed on the transparent electrode 177, an electrolyte layer 173 formed on the non-transmission layer 171, and a reflection layer 175 formed on the electrolyte layer 173.

The non-transmission layer 171 may be switched into the transmissive state or the non-transmissive state. In other words, with a voltage is applied to the optical switching element 170, the non-transmission layer 171 may be switched into the transmissive state or the non-transmissive state. The transmissive state refers to a state in which light transmission is allowed while the layer is in a transparent state, and the non-transmissive state refers to a state in which light transmission is not allowed while the layer is in an opaque state. The non-transmission layer 171 may also be defined as a layer which can be switched to the transmissive state or the non-transmissive state according to the application of a voltage.

The non-transmission layer 171 may be made of transition metal oxides having a cathodic characteristic, but is not limited thereto. The transition metal oxides with an anodic characteristic are materials that are usually in the opaque state but are switched into the transparent state when receiving protons. For example, the transition metal oxides with the anodic characteristic may include cobalt oxides, iridium oxides, nickel oxides, rhodium oxides, or combinations thereof, but are not limited thereto.

Furthermore, the non-transmission layer 171 may have a form of a single layered film made of a single material among the multiple transition metal oxides with the anodic characteristic, a single layered film made of a combination of different materials, a multi-layered film formed of a plurality of single layered films each made of a single material, or a multi-layered film formed of a plurality of single layered films each made of a combination of different materials.

The electrolyte layer 173 may include any electrolyte material that allows the current to flow.

The reflection layer 175 may be switched into the transmissive state or the reflective state. The reflective state refers to a state in which light is reflected, which may be a mirror state. The reflection layer 175 may be defined as a layer to be switched into the transmissive state or the reflective state according to application of a voltage. The reflection layer 175 may be made of metals or metal alloys, but is not limited thereto.

When a voltage is applied, the non-transmission layer 171 and reflection layer 175 may trigger an oxidation-reduction reaction which causes optical switching. When a voltage is applied to the optical switching element 170, the non-transmission layer 171 may be switched into the non-transmissive state and at the same time, the reflection layer 175 may be switched into the transmissive state, or alternatively, the non-transmission layer 171 may be switched into the transmissive state and at the same time, the reflection layer 175 may be switched into the reflective state.

Overall, the optical switching element 170 may appear to be in a non-transmissive mode or a reflective mode by being switched between the non-transmissive state and the reflective state.

This may operate the optical switching element 170 in the non-transmissive mode (or opaque state) as shown in FIG. 10A while the transparent display panel 110 is turned on, and in the reflective mode (or reflective state) as shown in FIG. 10B while the transparent display panel 110 is turned off. This may enhance the contrast ratio of an image because the optical switching element 170 is in the opaque state while the transparent display panel 110 is turned on and outputs the image, and provide a mirror function because the optical switching element 170 is in the reflective state while the transparent display panel 110 is turned off.

It will be appreciated that the optical switching element 170 may further include a layer to enhance the characteristics in addition to what has been described.

Although not shown, in case there are multiple optical switching elements 170, they may be arranged on either side of the transparent display panel 110. In the optical switching element 170 formed on either side of the transparent display panel 110, if the non-transmission layer 171 is in a non-transmissive state, the reflection layer 175 may be in transmissive state, and otherwise if the non-transmission layer 171 is in transmissive state, the reflection layer 175 may be in reflective state.

Figure 11:
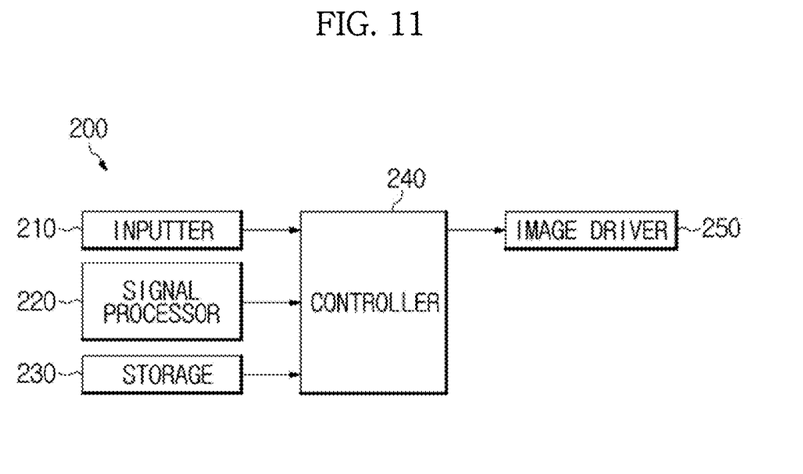
FIG. 11 is a block diagram of a driver, in accordance with an exemplary embodiment.

FIG. 11 is a block diagram of a driver applied to the display device 100.

Although not shown, a driver 200 as will now be described may be, but not exclusively, placed on a frame of a television, a window frame of a window, etc.

As shown in FIG. 11, the driver 200 may include an inputter 210, a signal processor 220, a storage 230, a controller 240, and an image driver 250.

More specifically, the inputter 210 may receive power-on and off signals and signals input through a user interface (not shown), and transmit the received signals to the controller 240.

The signal processor 220 may perform signal processing on broadcast signals or image signals received externally which are to be displayed on the transparent display panel 110. In this regard, the signal processor 220 may break the broadcast signal apart into image signals having image data, sound signals having sound data, additional signals having additional data, and may process the image signals and sound signals.

The storage 230 may store RGB information regarding colors associated with the display device 100.

The controller 240 may control the transparent display panel 110 to be driven based on the signal processing results. More specifically, the controller 240 may correct colors of an input image and control the image driver 250 to output the color-corrected image. For example, the controller 240 may control the resolution of the signal-processed image to fit the resolution of the transparent display panel 110, obtain RGB information of the resolution-controlled image, and compensate the RGB information based on the RGB information regarding colors of a color film.

The controller 240 may also control the image driver 250 to switch the non-transmission layers of the optical switching elements 130 and 170 into the transmissive state or the non-transmissive state, and switch the reflection layers of the optical switching elements 130 and 170 into the transmissive state or the reflective state.

In the case of the optical switching element 130 of FIG. 3, the controller 240 may switch the non-transmission layer 131 and reflection layer 135 both to the transmissive state, or switch the non-transmission layer 131 and reflection layer 135 into the non-transmissive state and reflective state, respectively.

In the case of the optical switching element 170 of FIG. 9, the controller 240 may switch the non-transmission layer 171 into the non-transmissive state while switching the reflection layer 175 into the transmissive state, or alternatively, may switch the non-transmission layer 171 into the transmissive state while switching the reflection layer 175 into the reflective state.

According to an aspect of the exemplary embodiments, a benefit of increasing the contrast ratio of an image may be expected when the image is viewed through a side of a display device.

According to another aspect of the exemplary embodiments, benefits of providing different forms of services may be expected by improving utilization of both sides of a display device, such as providing images through both sides of the display device, providing an image through one side of the display device, providing an image through one side of the display device while providing a mirror function through the other side of the display device, or providing mirror functions through both sides of the display device, or the like.

Several exemplary embodiments have been described, but a person of ordinary skill in the art will understand and appreciate that various modifications can be made without departing the scope of the inventive concept. The foregoing exemplary embodiments are merely exemplary and are not to be construed as limiting the exemplary embodiments. The exemplary embodiments can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A display device comprising:
a transparent display panel; and
an optical switching element arranged on the transparent display panel and configured to be switched to any one of a transmissive state, a non-transmissive state, and a reflective state,
wherein the optical switching element includes a non-transmission layer formed with a first side contacting the transparent display panel and configured to switch to the transmissive state or the non-transmissive state, and a reflection layer formed on a second side of the non-transmission layer which is opposite to the first side, and configured to switch to the transmissive state or the reflective state.

2. The display device of claim 1, wherein the non-transmission layer is made of a transition metal oxide having a cathodic characteristic.

3. The display device of claim 2, wherein if a voltage is applied to the optical switching element, the non-transmission layer and the reflection layer are both switched to the transmissive state, or the non-transmission layer is switched to the non-transmissive state and the reflection layer is switched to the reflective state.

4. The display device of claim 1, wherein the non-transmission layer is made of a transition metal oxide having an anodic characteristic.

5. The display device of claim 4, wherein if a voltage is applied to the optical switching element, the non-transmission layer is switched to the non-transmissive state and the reflection layer is switched to the transmissive state, or the non-transmission layer is switched to the transmissive state and the reflection layer is switched to the reflective state.

6. The display device of claim 4, wherein the non-transmission layer comprises one of a single layered film made of a single material from among multiple transition metal oxides, a single layered film made of a combination of different materials, a multi-layered film formed of a plurality of single layered films each made of a single material, and a multi-layered film formed of a plurality of single layered films each made of a combination of different materials.

7. The display device of claim 1, further comprising:
an electrolyte layer formed between the non-transmission layer and the reflection layer; and
a transparent electrode formed on a second side of the non-transmission layer.

8. The display device of claim 1, wherein the reflection layer is made of a metal or metal alloy.

9. The display device of claim 1, wherein if there are a plurality of optical switching elements, a first optical switching element of the plurality of optical switching elements is arranged on a first side of the transparent display panel and a second optical switching element of the plurality of optical switching elements is arranged on a second side of the transparent display panel.

10. The display device of claim 9, wherein a non-transmission layer and a reflection layer of the first optical switching element formed on a first side of the transparent display panel are in the transmissive state, and a non-transmission layer and a reflection layer of the second optical switching element formed on the second side of the transparent display panel are in the non-transmissive state and the reflective state, respectively.

11. The display device of claim 9, wherein a non-transmission layer and a reflection layer of the first optical switching element and a non-transmission layer and a reflection layer of the second optical switching element are in the transmissive state.

12. The display device of claim 9, wherein if a non-transmission layer of a first optical switching layer formed on a first side of the transparent display panel is in the non-transmissive state, a reflection layer of the first optical switching layer is in the reflective state, and if a non-transmission layer of a second optical switching layer formed on a second side of the transparent display panel is in the non-transmissive state, a reflection layer of the second optical switching layer is in the reflective state.

13. The display device of claim 9, wherein if a non-transmission layer of the first optical switching element and a non-transmission layer of the second optical switching element are in the non-transmissive state, a reflection layer of the first optical switching element and a reflection layer of the second optical switching element is in the transmissive state, and if the non-transmission layer of the first optical switching element and the non-transmission layer of the second optical switching element are in the transmissive state, the reflection layer of the first optical switching element and the reflection layer of the second optical switching element are in the reflective state.

14. The display device of claim 1, wherein the transparent display panel is an Organic Light Emitting Diode (OLED) display panel.

15. The display device of claim 1, wherein the non-transmission layer is made of a transition metal oxide having one of anodic and cathodic characteristic and wherein, the optical switching element is configured to receive voltage and in response to the received voltage, both the non-transmission layer and the reflection layer are configured to switch states.

16. The display device of claim 1, further comprising another optical switching element positioned on same side as the optical switching element with respect to the transparent display panel.

17. A display device comprising:
a transparent display panel;
an optical switching element arranged on the transparent display panel; and
a driver configured to switch a first side of the optical switching element into a transmissive state or a non-transmissive state and configured to switch a second side of the optical switching element into the transmissive state or a reflective state,
wherein the optical switching element comprises a non-transmission layer sandwiched between the transparent display panel and a reflection layer.

18. A display device comprising:
a transparent display panel;
a first optical switching element formed on a first side of the transparent display panel and configured to switch between one of a transmissive state, a non-transmissive state, and a reflective state; and
a second optical switching element formed on a second side of the transparent display panel, which is opposite to the first side of the transparent display panel, and is configured to switch between one of the transmissive state, the non-transmissive state, and the reflective state,
wherein each of the first optical switching element and the second optical switching element comprises a non-transmission layer sandwiched between the transparent display panel and a reflection layer.

* * * * *